United States Patent
Klemens et al.

(10) Patent No.: US 8,847,351 B2
(45) Date of Patent: Sep. 30, 2014

(54) INTEGRATED POWER AMPLIFIER WITH LOAD INDUCTOR LOCATED UNDER IC DIE

(75) Inventors: Guy Klemens, San Diego, CA (US); Thomas A Myers, San Diego, CA (US); Norman L Frederick, Jr., Vista, CA (US); Yu Zhao, San Diego, CA (US); Babak Nejati, San Diego, CA (US); Nathan M Pletcher, Encinitas, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 697 days.

(21) Appl. No.: 12/705,493

(22) Filed: Feb. 12, 2010

(65) Prior Publication Data

US 2010/0327976 A1 Dec. 30, 2010

Related U.S. Application Data

(60) Provisional application No. 61/221,483, filed on Jun. 29, 2009.

(51) Int. Cl.
*H01L 27/08* (2006.01)

(52) U.S. Cl.
USPC ............................. 257/531; 257/499; 257/528

(58) Field of Classification Search
USPC .......................................... 257/499, 528, 531
See application file for complete search history.

(56) References Cited

U.S. PATENT DOCUMENTS 5,752,182 A  5/1998 Nakatsuka et al.
6,310,386 B1 10/2001 Shenoy
(Continued)

FOREIGN PATENT DOCUMENTS

CN  1918786 A  2/2007
EP  2071671     6/2009
(Continued)

OTHER PUBLICATIONS

Donald Y C Lie et al: "Highly Efficient Class E SiGe Power Amplifier Design for Wireless Sensor Network Applications",Bipolar/Bicmos Circuits and Technolog; Meeting, 2007. BCTM '07. IEEE, IEEE, Piscataway, NJ, USA, Sep. 1, 2007 (Sep. 1, 2007), pp. 160-163, XP031149285.

(Continued)

Primary Examiner — Jae Lee
(74) Attorney, Agent, or Firm — Ramin Mobarhan (57) ABSTRACT

A compact integrated power amplifier is described herein. In an exemplary design, an apparatus includes (i) an integrated circuit (IC) die having at least one transistor for a power amplifier and (ii) an IC package having a load inductor for the power amplifier. The IC die is mounted on the IC package with the transistor(s) located over the load inductor. In an exemplary design, the IC die includes a transistor manifold that is placed over the load inductor on the IC package. The transistor(s) are fabricated in the transistor manifold, have a drain connection in the center of the transistor manifold, and have source connections on two sides of the transistor manifold. The IC die and the IC package may include one or more additional power amplifiers. The transistor(s) for each power amplifier may be located over the load inductor for that power amplifier.

25 Claims, 11 Drawing Sheets

(56) References Cited

U.S. PATENT DOCUMENTS

| | | | |
|---|---|---|---|
| 6,342,815 B1 | 1/2002 | Kobayashi | |
| 2002/0017699 A1* | 2/2002 | Shenoy | 257/531 |
| 2003/0011008 A1* | 1/2003 | Nelson | 257/275 |
| 2003/0112076 A1 | 6/2003 | Wang | |
| 2005/0133909 A1 | 6/2005 | Franca-Neto | |
| 2005/0134410 A1 | 6/2005 | Franca-Neto | |
| 2007/0096160 A1 | 5/2007 | Beroz et al. | |
| 2007/0139112 A1 | 6/2007 | Bocock et al. | |
| 2008/0315356 A1* | 12/2008 | Reisner | 257/531 |
| 2008/0315954 A1 | 12/2008 | Staszewski et al. | |
| 2009/0085666 A1* | 4/2009 | Ohnishi et al. | 330/286 |
| 2009/0267232 A1* | 10/2009 | Morel et al. | 257/758 |

FOREIGN PATENT DOCUMENTS

| | | | | |
|---|---|---|---|---|
| EP | 2071671 A1 | * | 6/2009 | H01Q 23/00 |
| JP | 60225449 A | | 11/1985 | |
| JP | H0832018 A | | 2/1996 | |
| WO | WO/2005/076465 | * | 8/2005 | H03F 1/22 |
| WO | WO2005076465 A1 | | 8/2005 | |
| WO | WO2008007258 A2 | | 1/2008 | |

OTHER PUBLICATIONS

Huo, X. et al., "Silicon-on-organic integration of a 2.4GHz VCO using high Q copper inductors and solder-bumped flip chip technology", Proceedings of the IEEE, Custom Integrated Circuits Conference, Sep. 2003, pp. 537-540.

International Search Report and Written Opinion-PCT/US2010/040488, International Search Authority-European Patent Office-Feb. 3, 2011.

Partial International Search Report-PCT/US2010/040488-International Search Authority, European Patent Office, Oct. 6, 2010.

Tu S H-L et al: "5.25 GHz CMOS cascode power amplifier for 802.11a wireless local area network",IET Microwaves Antennas & Propagation, vol. 2, No. 6, Sep. 8, 2008 (Sep. 8, 2008), pp. 627-634, XP006031674.

Xiao Huo et al., "Silicon-on-Organic Integration of a 2.4-GHz VCO Using High-Q Copper Inductors and Solder-Bumped Flip Chip Technology", IEEE Transactions on Components and Packaging Technologies, Mar. 2009, pp. 191-196, vol. 32 Issue 1.

Kyu Hwan An et al.; Power-Combining Transformer Techniques for Fully-Integrated CMOS Power Amplifiers, Solid-State Circuits, IEEE Journal of; Vol. 43 , Issue: 5; Digital Object Identifier: 10.1109/JSSC.2008.920349 Publication Year: 2008 , pp. 1064-1075.

* cited by examiner

INTEGRATED POWER AMPLIFIER WITH LOAD INDUCTOR LOCATED UNDER IC DIE

CLAIM OF PRIORITY UNDER 35 U.S.C. §119

The present Application for Patent claims priority to Provisional U.S. Application Ser. No. 61/221,483, entitled "INDUCTOR FOR INTEGRATED POWER AMPLIFIERS," filed Jun. 29, 2009, assigned to the assignee hereof, and expressly incorporated herein by reference.

BACKGROUND

I. Field

The present disclosure relates generally to electronics, and more specifically to amplifiers.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA), the receiver may include a low noise amplifier (LNA), and the transmitter and receiver may include variable gain amplifiers (VGAs).

A power amplifier may be used to amplify an input radio frequency (RF) signal and provide an output RF signal suitable for transmission. The power amplifier may be implemented with a load inductor connected to a power supply. The load inductor may also be referred to as an RF choke and may be used for various purposes such as filtering of the output RF signal, attenuation of noise from the power supply, output impedance matching, providing high in-band impedance, improving gain, etc. It may be desirable to implement the load inductor such that good performance can be achieved for the power amplifier.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for implementing an integrated power amplifier with a load inductor located under an IC die are described herein. The techniques may be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the techniques for a wireless communication device is described below.

Figure 1:
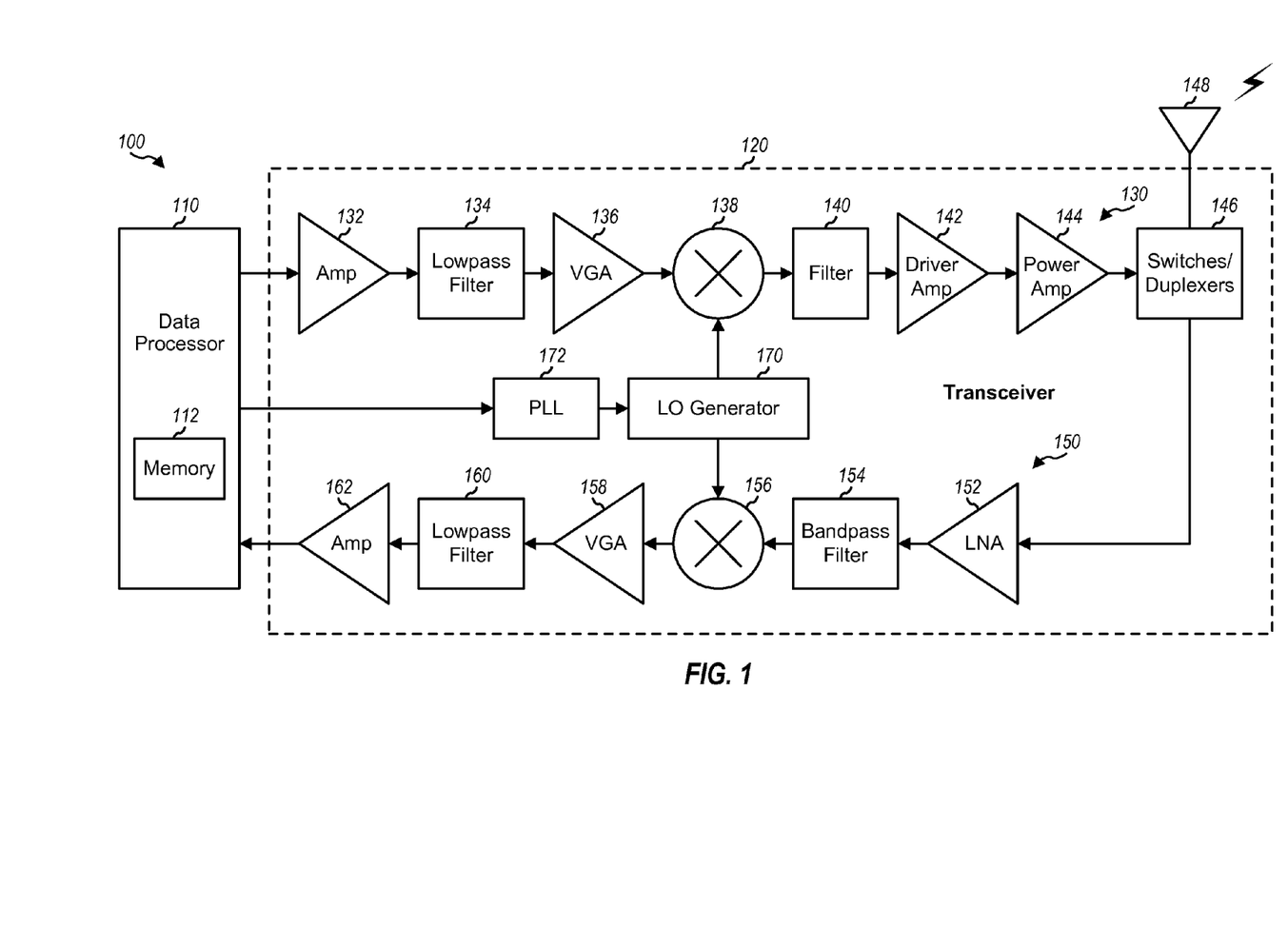
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to RF by a mixer 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. All or a portion of transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

Figure 2:
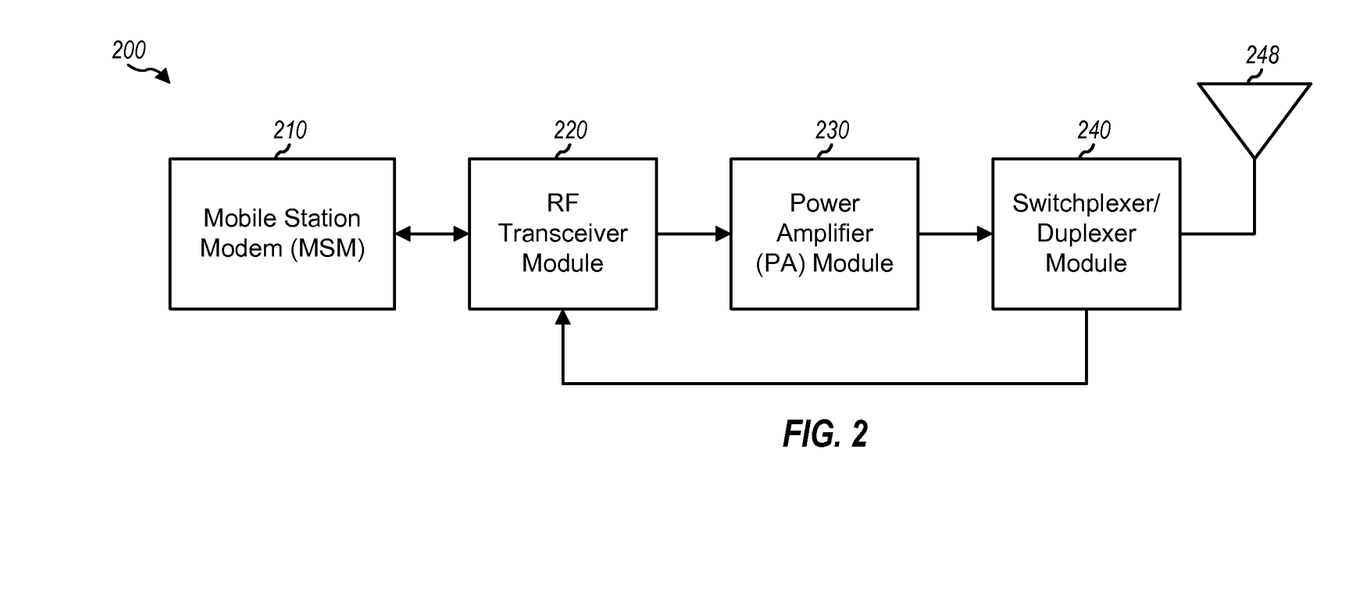
FIG. 2 shows an implementation of the wireless communication device in FIG. 1.

FIG. 2 shows a block diagram of an exemplary design of a wireless communication device 200, which may be one implementation of wireless communication device 100 in FIG. 1. In this exemplary design, wireless device 200 includes a mobile station modem (MSM) 210, an RF transceiver (RTR) module 220, a power amplifier (PA) module 230, a switchplexer/duplexer module 240, and an antenna 248. MSM 210 may include digital circuits (e.g., data processor 110 in FIG. 1) that can perform various functions for wireless device 100, e.g., processing for data transmission and reception. MSM 210 may be an ASIC commercially available from Qualcomm Incorporated or some other ASIC. RTR module 220 may include various circuits in a transceiver, e.g., all circuits in transceiver 120 in FIG. 1 except for power amplifier 144, switches/duplexers 146, and possibly driver amplifier 142. RTR module 220 may be an RFIC commercially available from Qualcomm Incorporated or some other RFIC. PA module 230 may include power amplifier 144 and possibly driver amplifier 142 in FIG. 1. Switchplexer/duplexer module 240 may include switches/duplexers 146 in FIG. 1.

FIG. 2 shows an exemplary implementation of wireless device 200 comprising four different modules that may be manufactured separately. Wireless device 200 may also be implemented with fewer or more modules. For example, RTR module 220 and PA module 230 may be combined into one module. PA module 230 and switchplexer/duplexer module 240 may also be combined into one module.

In general, a wireless device may include one or more power amplifiers to generate one or more output RF signals. The power amplifiers may be implemented with various circuit designs. Some exemplary circuit designs of power amplifiers are described below.

Figure 3A:
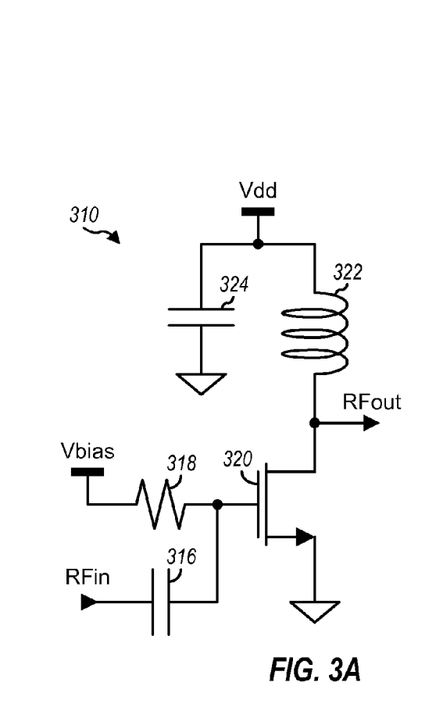
FIGS. 3A, 3B and 3C show schematic diagrams of three power amplifiers.

FIG. 3A shows a schematic diagram of an exemplary design of a power amplifier 310, which may be used for power amplifier 144 in FIG. 1. Power amplifier 310 includes an N-channel metal oxide semiconductor (NMOS) transistor 320 having its source coupled to circuit/AC ground and its drain providing an output RF signal (RFout). A load inductor 322 (or RF choke) is coupled between an upper power supply (Vdd) and the drain of NMOS transistor 320. An AC coupling/DC blocking capacitor 316 has one end receiving an input RF signal (RFin) and the other end coupled to the gate of NMOS transistor 320. A resistor 318 has one end receiving a bias voltage (Vbias) and the other end coupled to the gate of NMOS transistor 320. The Vbias voltage may be selected to provide the desired bias current and gain for NMOS transistor 320. A bypass capacitor 324 is coupled between the Vdd supply and circuit ground and provides filtering for the Vdd supply.

Figure 3B:
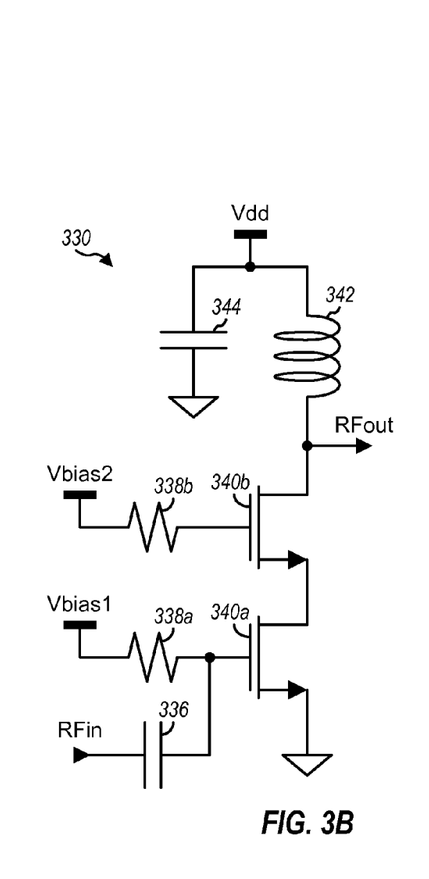

FIG. 3B shows a schematic diagram of an exemplary design of a stacked power amplifier 330, which may also be used for power amplifier 144 in FIG. 1. Power amplifier 330 includes two NMOS transistors 340a and 340b coupled in a stack. NMOS transistor 340a has its source coupled to circuit ground and its gate receiving an RFin signal via an AC coupling capacitor 336. NMOS transistor 340b has its source coupled to the drain of NMOS transistor 340a and its drain providing an RFout signal. A load inductor 342 is coupled between the Vdd supply and the drain of NMOS transistor 340b. A bypass capacitor 344 is coupled between the Vdd supply and circuit ground. The gate of NMOS transistor 340a receives a Vbias1 voltage via a resistor 338a, and the gate of NMOS transistor 340b receives a Vbias2 voltage via a resistor 338b.

The RFout signal may have a large voltage swing, which may exceed a breakdown voltage of each NMOS transistor. The large voltage swing of the RFout signal may be split or distributed approximately equally across NMOS transistors 340a and 340b. Each NMOS transistor may then observe only a fraction of the voltage swing, which should be less than the breakdown voltage of each NMOS transistor to achieve high reliability. The use of stacked transistors may be especially desirable for high frequency power amplifiers implemented with transistors that are fabricated with deep sub-micron IC processes and have low breakdown voltages. The Vbias1 and Vbias2 voltages may be selected to provide the desired voltage splitting of the RFout signal, e.g., so that each NMOS transistor observes about half of the voltage swing.

Figure 3C:
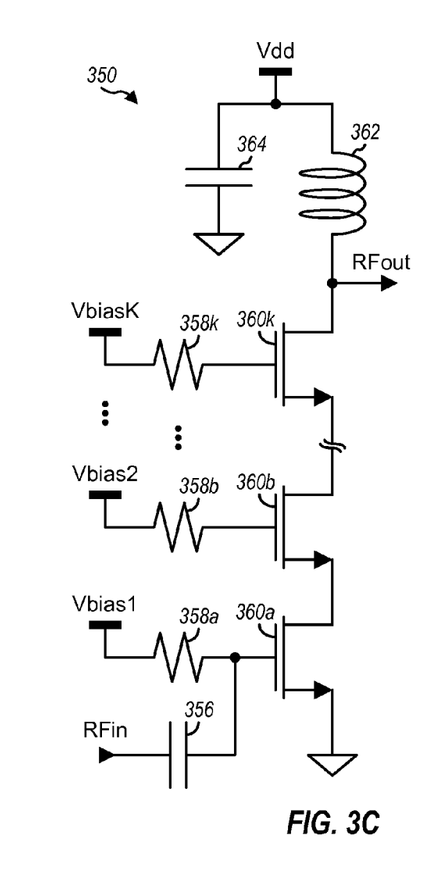

FIG. 3C shows a schematic diagram of an exemplary design of a stacked power amplifier 350, which may also be used for power amplifier 144 in FIG. 1. Power amplifier 350 includes K NMOS transistors 360a through 360k coupled in a stack, where K may be any integer value. NMOS transistor 360a has its source coupled to circuit ground and its gate receiving an RFin signal via an AC coupling capacitor 356. Each higher up NMOS transistor 360 in the stack has its source coupled to the drain of another NMOS transistor below in the stack. The topmost NMOS transistor 360k has its drain providing an RFout signal. A load inductor 362 is coupled between the Vdd supply and the drain of NMOS transistor 360k. A bypass capacitor 364 is coupled between the Vdd supply and circuit ground. The gates of NMOS transistor 360a through 360k receive Vbias1 through VbiasK voltages via resistor 358a through 358k, respectively. The Vbias1 through VbiasK voltages may be selected to provide the desired voltage splitting of the RFout signal, e.g., so that each NMOS transistor observes about 1/K-th of the voltage swing.

Figure 4A:
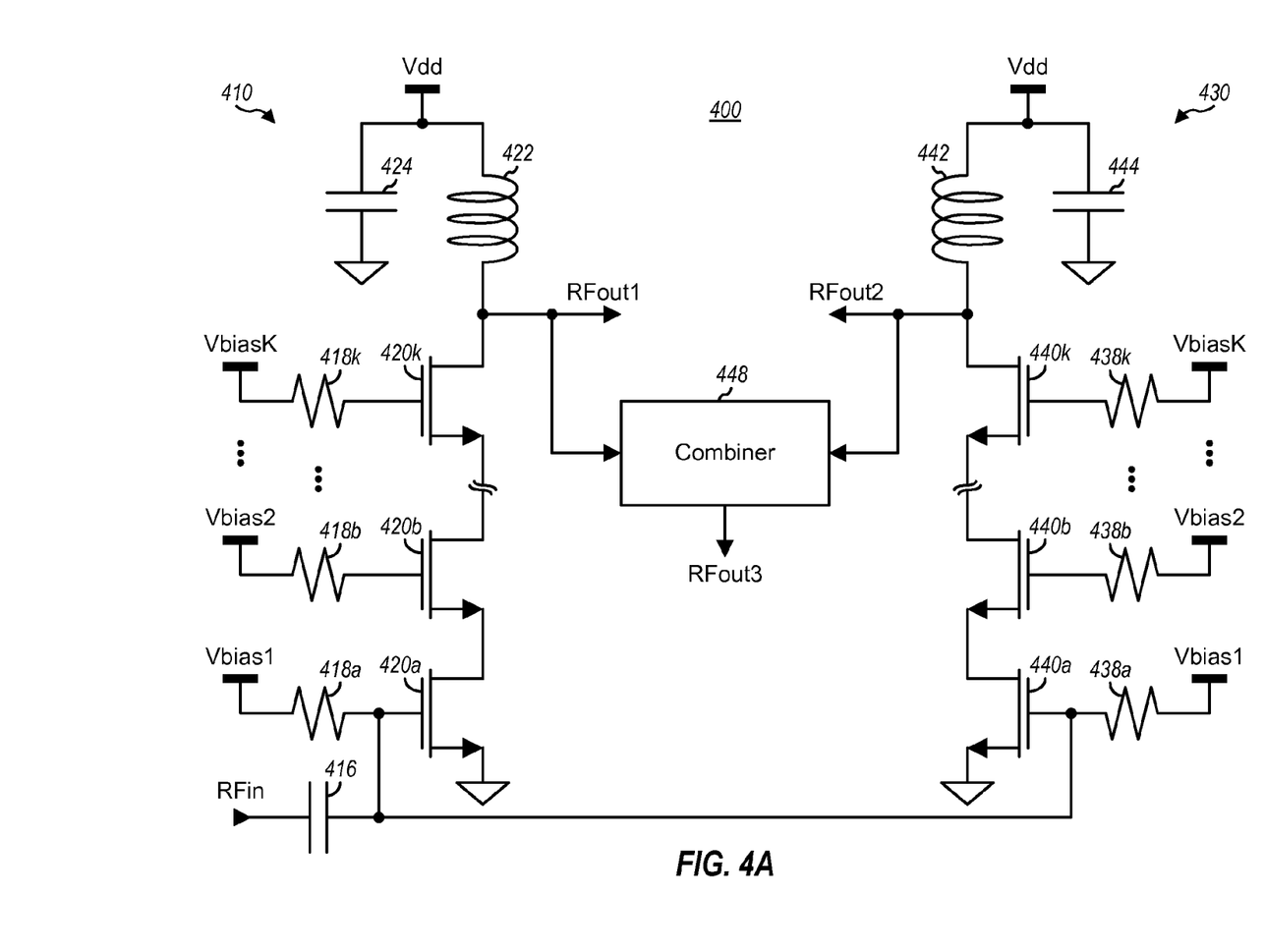
FIGS. 4A and 4B show schematic diagrams of two dual power amplifiers.

FIG. 4A shows a schematic diagram of an exemplary design of an output circuit 400 comprising dual stacked power amplifiers 410 and 430. Power amplifier 410 includes K NMOS transistors 420a through 420k, a load inductor 422, a bypass capacitor 424, an AC coupling capacitor 416, and resistors 418a through 418k, which are coupled as described above for power amplifier 350 in FIG. 3C. Power amplifier 430 includes K NMOS transistors 440a through 440k, a load inductor 442, a bypass capacitor 444, and resistors 438b through 438k, which are also coupled as described above for power amplifier 350.

Power amplifier 410 receives an RFin signal and provides a first output RF signal (RFout1). Power amplifier 430 also receives the RFin signal and provides a second output RF signal (RFout2). A combiner 448 receives the RFout1 signal and the RFout2 signal and, when enabled, combines the two received signals and provides a third output RF signal (RFout3). Power amplifiers 410 and 430 may support different radio technologies (e.g., CDMA and GSM), different output power levels, different frequency bands, etc.

Output circuit 400 may support a number of operating modes. In a first mode, both power amplifiers 410 and 430 may be selected/enabled, and combiner 448 may combine the RFout1 and RFout2 signals and provide the RFout3 signal having high output power. In a second mode, power amplifier 410 may be enabled and may provide the RFout1 signal having medium output power, and power amplifier 430 may be disabled. In a third mode, power amplifier 430 may be enabled and may provide the RFout2 signal having medium output power, and power amplifier 410 may be disabled.

Figure 4B:
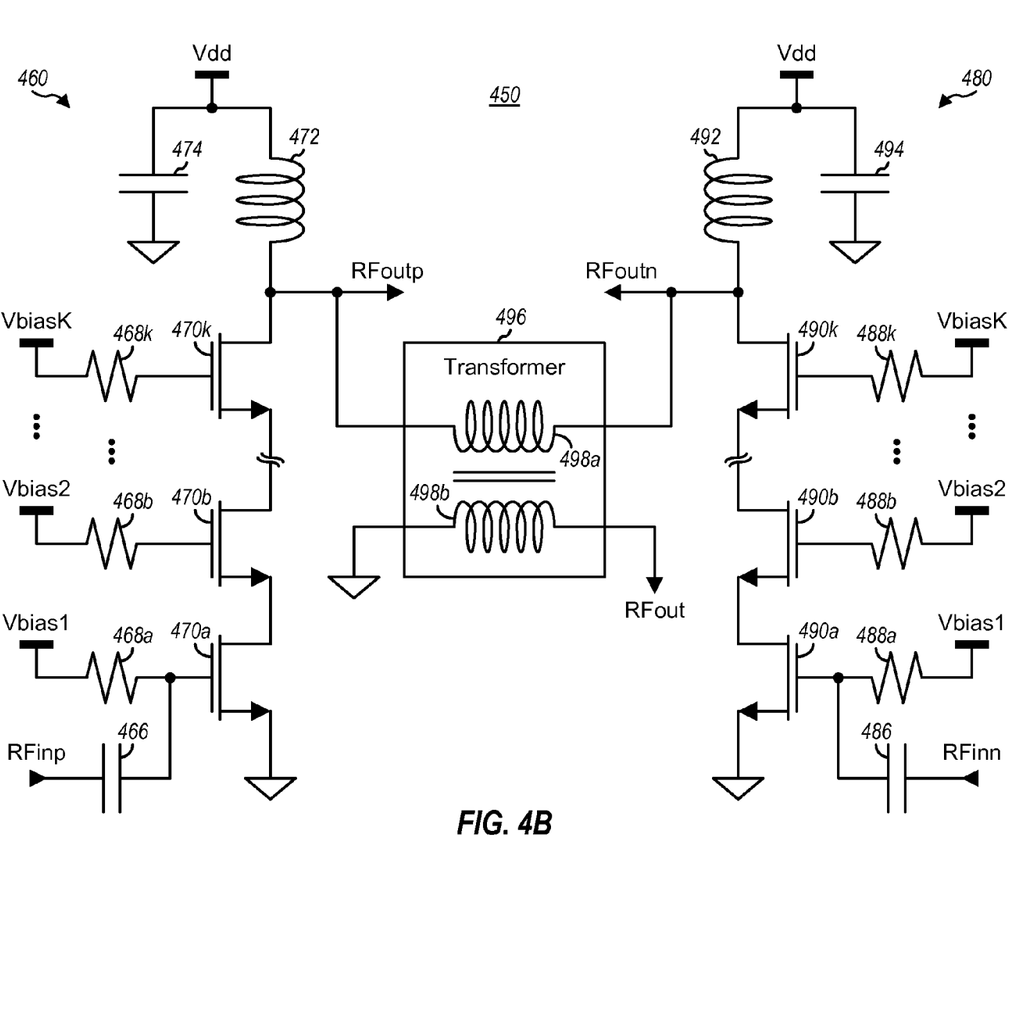

FIG. 4B shows a schematic diagram of an exemplary design of an output circuit 450 comprising dual stacked power amplifiers 460 and 480. Power amplifier 460 includes K NMOS transistors 470a through 470k, a load inductor 472, a bypass capacitor 474, an AC coupling capacitor 466, and resistors 468a through 468k, which are coupled as described above for power amplifier 350 in FIG. 3C. Power amplifier 480 includes K NMOS transistors 490a through 490k, a load inductor 492, a bypass capacitor 494, an AC coupling capacitor 486, and resistors 488b through 488k, which are also coupled as described above for power amplifier 350.

Power amplifier 460 receives a non-inverting input RF signal (RFinp) and provides a non-inverting output RF signal (RFoutp). Power amplifier 480 receives an inverting input RF signal (RFinn) and provides an inverting output RF signal (RFoutn). A transformer 496 includes a primary coil 498a and a secondary coil 498b. Primary coil 498a has one end receiving the RFoutp signal and the other end receiving the RFoutn signal. Secondary coil 498b has one end coupled to circuit ground and the other end providing an RFout signal.

Power amplifiers 460 and 480 form a differential power amplifier that (i) receives a differential input RF signal comprising the RFinp and RFinn signals and (ii) provides a differential output RF signal comprising the RFoutp and RFoutn signals. Transformer 496 receives the differential output RF signal, performs differential to single-ended conversion, and provides the single-ended output RF signal.

FIGS. 3A to 4B show some exemplary designs of power amplifiers. Power amplifiers may also be implemented with other types of transistors, other designs, and/or other configurations. For example, power amplifiers may be implemented with P-channel MOS (PMOS) transistors, bipolar junction transistors (BJTs), bipolar-CMOS (BiCMOS) transistors, silicon germanium (SiGe) transistors, gallium arsenide (GaAs) transistors, etc.

A power amplifier may include a load inductor or RF choke, e.g., as shown in each of FIGS. 3A to 4B. The load inductor may have appreciable inductance and should have the lowest possible loss since the gain of the power amplifier may be directly related to the in-band impedance of the load inductor. Furthermore, all of the output current passes through the load inductor, so any loss in the inductor would lower the power added efficiency (PAE) of the power amplifier.

One or more power amplifiers may be fabricated on an IC die, which may be encapsulated in an IC package, e.g., for PA module 230 in FIG. 2. Each power amplifier may include a load inductor, which may be fabricated on the IC package in order to reduce cost and obtain other benefits.

Figure 5:
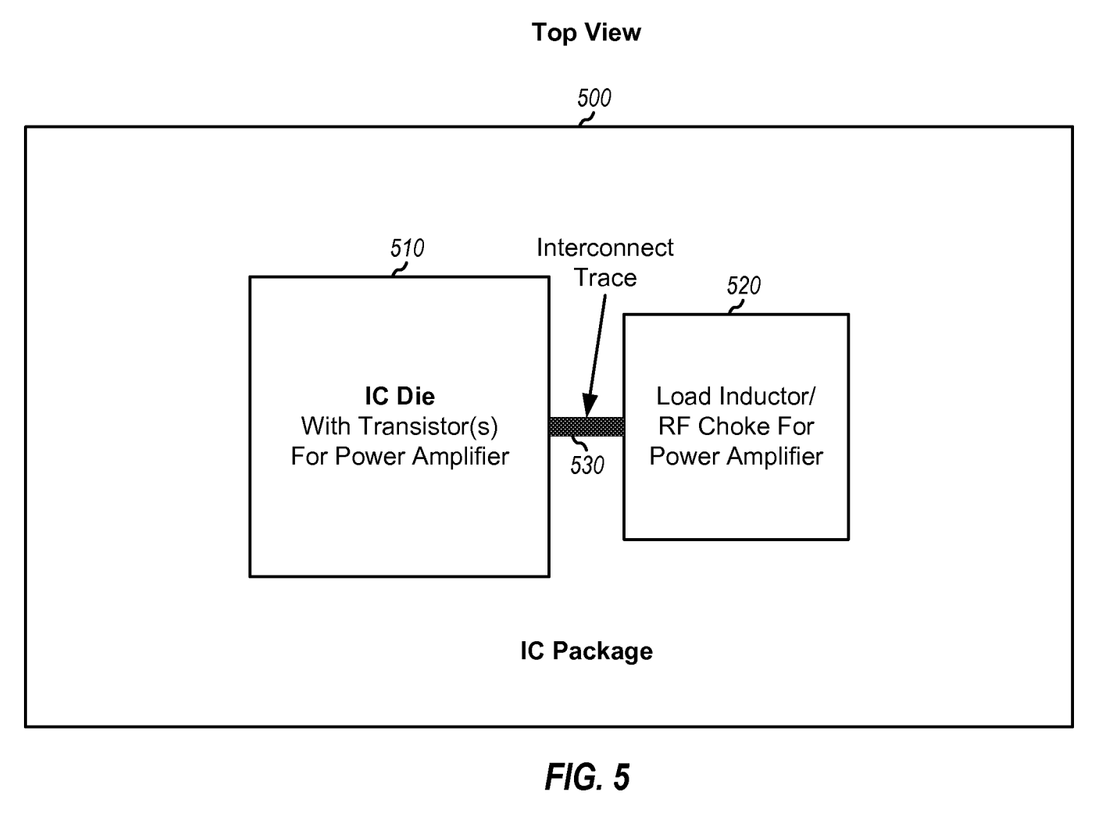
FIG. 5 shows an integrated circuit (IC) package with a load inductor.

FIG. 5 shows a top view of an IC package 500 comprising a load inductor. A power amplifier and possibly other circuits may be fabricated on an IC die 510 with a suitable IC process technology. An IC die may also be referred to as a die, a chip, etc. IC die 500 may be mounted on IC package 500. A load inductor/RF choke 520 for the power amplifier may be fabricated on a metal layer in IC package 500. IC die 510 and load inductor 520 may be located side by side, as shown in FIG. 5. An interconnect trace 530 may connect the power amplifier on IC die 510 to load inductor 520 on IC package 500.

A load inductor may be fabricated on an IC package, e.g., as shown in FIG. 5. The load inductor may be fabricated with (i) wide metal traces to obtain low resistance for low loss and high quality factor (Q) and (ii) long traces to obtain the desired inductance. The exemplary design shown in FIG. 5 may occupy more package area and may have more loss due to interconnect trace 530 between the IC die and the load inductor.

In an aspect, an IC die for one or more power amplifiers may be placed directly over one or more load inductors formed on an IC package. This arrangement may provide certain advantages. First, placing the IC die over the load inductor(s) may result in a more compact implementation and may save area. Second, lower loss may be obtained by placing the IC die closer to the load inductor(s) and interconnecting the two with solder balls.

Figure 6A:
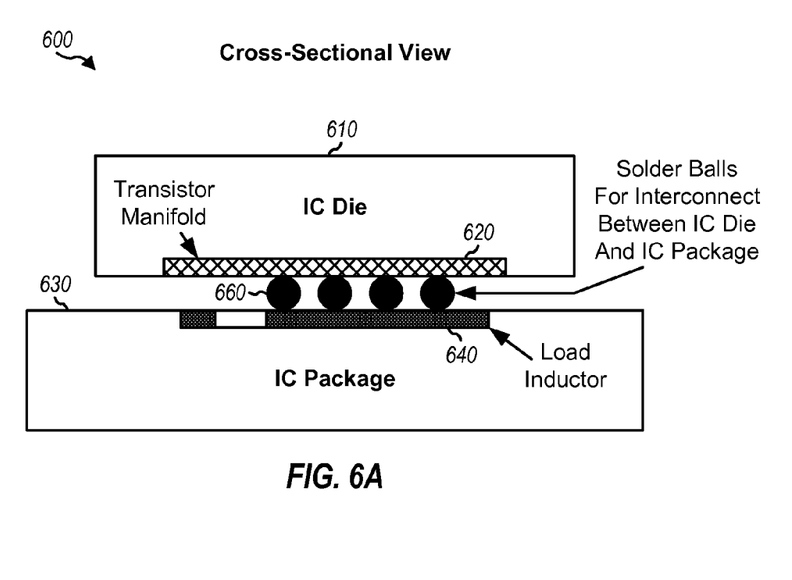
FIGS. 6A and 6B show a cross-sectional view and a top view of a PA module comprising an integrated power amplifier with a flip-chip configuration.

FIG. 6A shows a cross-sectional view of an exemplary design of a PA module 600 comprising an integrated power amplifier with a flip-chip configuration. PA module 600 includes an IC die 610 mounted on an IC package 630. IC die 610 includes a transistor manifold 620 on which one or more transistors for a power amplifier are fabricated. The power amplifier may be implemented with the exemplary design shown in FIG. 3A, 3B or 3C or some other design or configuration. IC package 630 includes a load inductor 640 fabricated on a metal layer in the IC package. Implementation of load inductor 640 on a thick metal layer in the IC package may result in low loss and high Q for the load inductor. IC die 610 is flipped upside down and mounted on IC package 630 such that transistor manifold 620 is placed over load inductor 640 on IC package 630. Transistor manifold 620 is electrically connected to load inductor 640 via solder balls 660 and is also electrically connected to circuit ground on IC package 630 via other solder balls. A short and low-loss interconnection between IC die 610 and load inductor 640 may be achieved via solder balls 660.

Figure 6B:
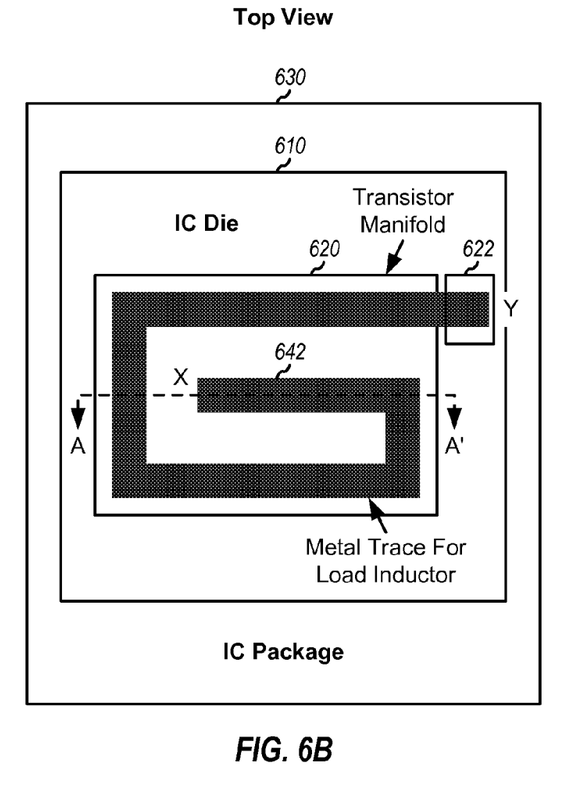

FIG. 6B shows a top view of PA module 600 in FIG. 6A. FIG. 6B shows the outline of transistor manifold 620, the outline of IC die 610, and the outline of IC package 630, which are not shown to scale in FIG. 6B. The side view in FIG. 6A is taken along line A-A' in FIG. 6B.

In the exemplary design shown in FIG. 6B, load inductor 640 is implemented with a metal trace 642 formed in a spiral pattern. A first end of metal trace 642 (denoted as X in FIG. 6B) is coupled to the drain of a transistor in transistor manifold 620 via solder balls 660 (not shown in FIG. 6B). A second end of metal trace 642 (denoted as Y) is coupled to a bypass capacitor 622 and the Vdd supply. Bypass capacitor 622 may be fabricated on IC die 610 and may have a short connection via solder balls to the second end of metal trace 642. This may improve performance over an implementation in which the bypass capacitor is located off-chip and connected to the Vdd supply via a relatively long trace. In general, load inductor 640 may be implemented with any pattern such as a spiral pattern, a double spiral pattern, a zig-zag pattern, etc. Load inductor 640 may also be implemented with any number of turns. The length and width of metal trace 642 for load inductor 640 may be selected to obtain the desired inductance and low loss for the load inductor.

Figure 6C:
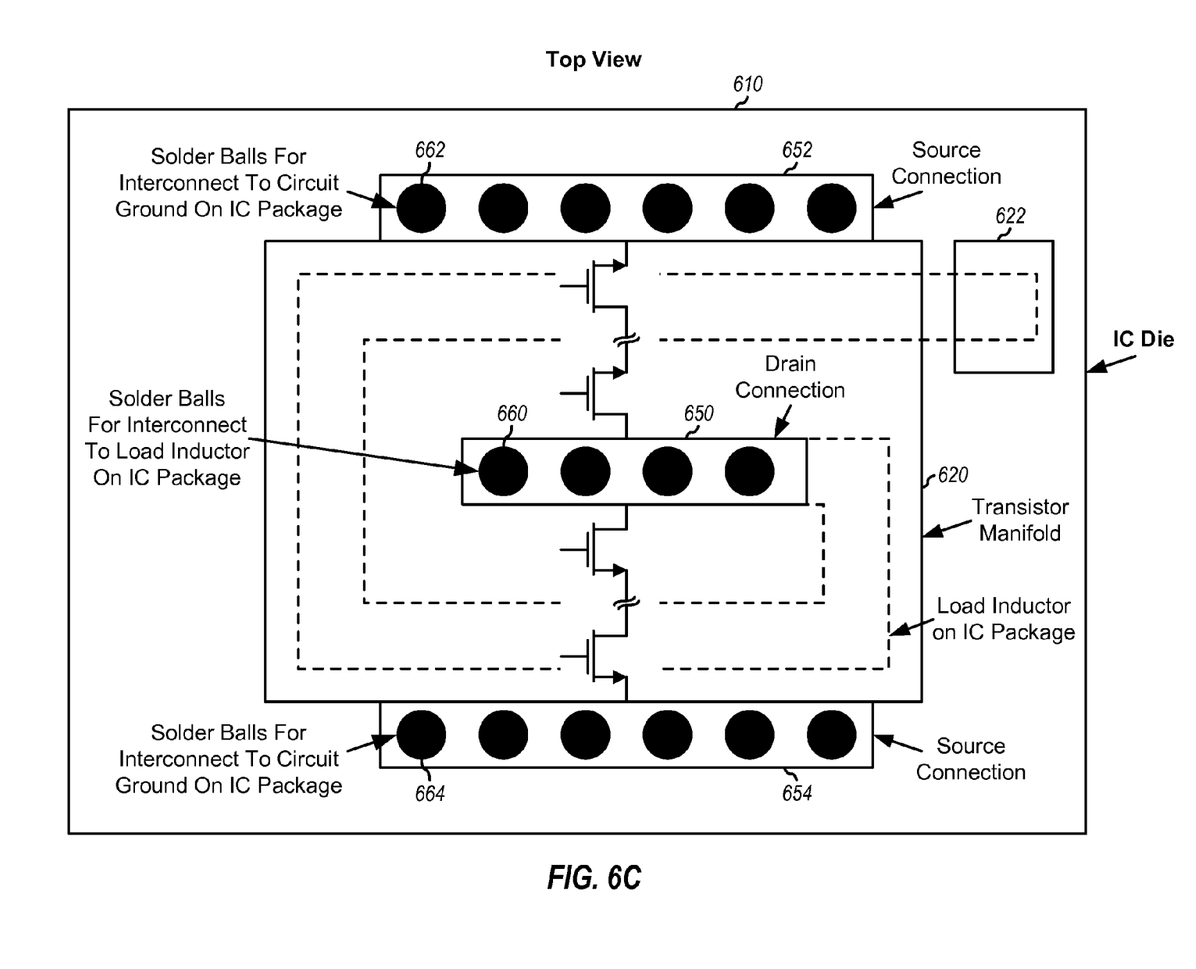
FIG. 6C shows a top view of an IC die.

FIG. 6C shows a top view of IC die 610 in FIG. 6A. IC die 610 may be mounted over load inductor 640 on IC package 630. The outline of load inductor 640 is shown by dashed lines in FIG. 6C.

IC die 610 includes transistor manifold 620 on which one or more transistors for the power amplifier are fabricated. The power amplifier may include multiple NMOS transistors coupled in a stack (as shown in FIG. 6C) or a single NMOS transistor (which may be considered as a stack of one NMOS transistor). Each NMOS transistor may be implemented as a long transistor that may be split in half A first half of the long transistor may be fabricated in a first half (e.g., the top half) of transistor manifold 620. A second half of the long transistor may be fabricated in a second half (e.g., the bottom half) of transistor manifold 620. The bottommost NMOS transistor in the stack may have its source coupled to (i) a source connection 652 above the top half of transistor manifold 620 and (ii) a source connection 654 below the bottom half of the transistor manifold. The topmost NMOS transistor in the stack may have its drain coupled to a drain connection 650 in the middle of transistor manifold 620. Drain connection 650 may be electrically connected to load inductor 640 on IC package 630 via solder balls 660. Source connection 652 may be electrically connected to circuit ground on IC package 630 via solder balls 662. Source connection 654 may be electrically connected to circuit ground on IC package 630 via solder balls 664.

In one exemplary design, as many solder balls as possible may be formed over each of connections 650, 652 and 654. The size of each solder ball and the spacing between solder balls may be governed by IC fabrication process design rules. Using more solder balls may reduce the resistance of the interconnection between transistor manifold 620 and IC package 630, which may reduce loss and improve efficiency.

The exemplary layout shown in FIG. 6C may provide certain advantages. First, one or more transistors in the power amplifier may be efficiently fabricated in transistor manifold 620. A compact layout may be achieved by implementing transistor manifold 620 in a block with drain connection 650 in the center. The two halves of the topmost transistor in the stack may share a common drain connection 650, which may have a low-loss electrical connection to load inductor 640. The two halves of the bottommost transistor in the stack may have separate source connections 652 and 654, which may provide low-loss electrical connections to circuit ground on IC package 630.

Figure 6D:
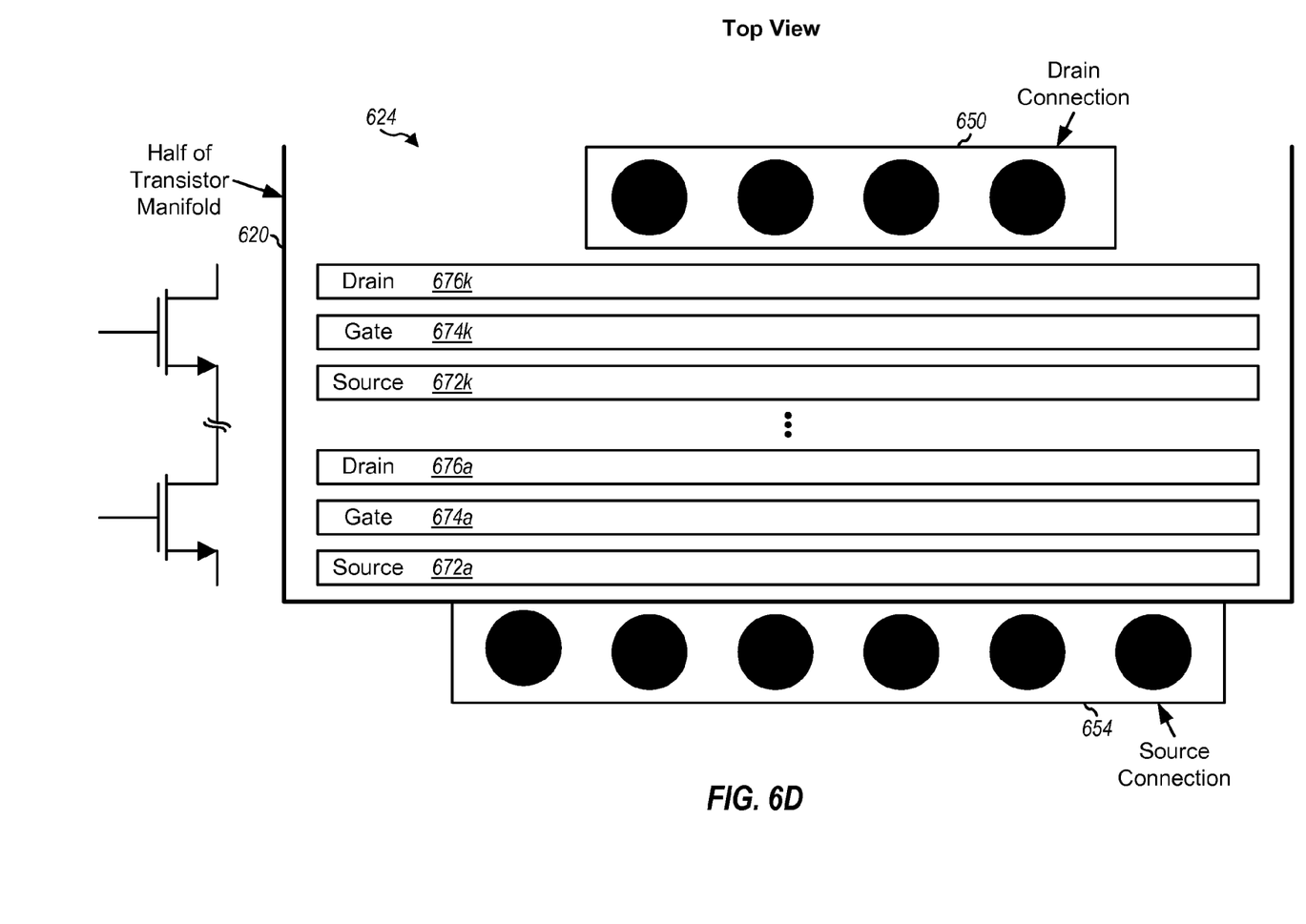
FIG. 6D shows a top view of a transistor manifold.

FIG. 6D shows a top view of an exemplary design of a bottom half 624 of transistor manifold 620 in FIG. 6C. In this exemplary design, the power amplifier fabricated on transistor manifold 620 includes a stack of K NMOS transistors, where K may be an integer value of one or greater. The bottommost NMOS transistor in the stack may be implemented with a conductive line 672a for the source, a conductive line 674a for the gate, and a conductive line 676a for the drain. Each NMOS transistor in the stack, except for the topmost and bottommost NMOS transistors, may be implemented with a first conductive line for the source, a second conductive line for the gate, and a third conductive line for the drain. The topmost NMOS transistor in the stack may be implemented with a conductive line 672k for the source, a conductive line 674k for the gate, and a conductive line 676k for the drain.

The K transistors for the power amplifier may also be implemented in other manners. For example, conductive line 676a may be used for both the drain of the bottommost NMOS transistor as well as the source of the next higher NMOS transistor in the stack. Similarly, conductive line 672k may be used for both the source of the topmost NMOS transistor as well as the drain of the next lower NMOS transistor in the stack. The top half of transistor manifold 620 may be a mirror image of the bottom half of transistor manifold 620.

Figure 7A:
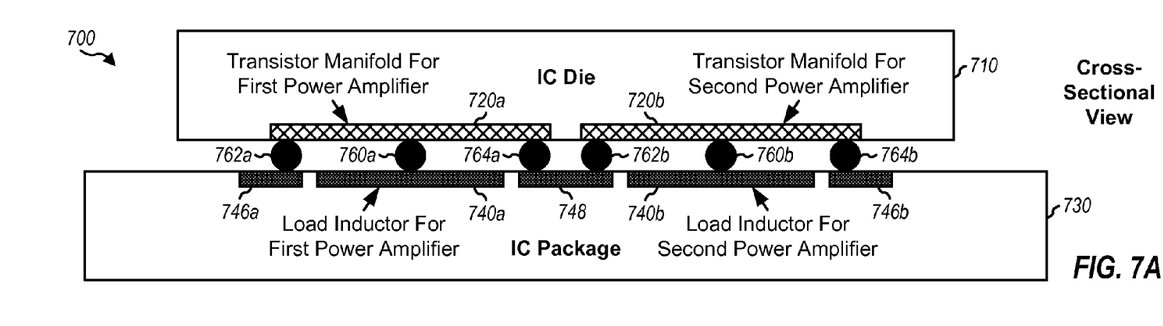
FIGS. 7A and 7B show a cross-sectional view and a top view of a PA module comprising dual integrated power amplifiers with a flip-chip configuration.

FIG. 7A shows a cross-sectional view of an exemplary design of a PA module 700 comprising dual integrated power amplifiers with a flip-chip configuration. PA module 700 includes an IC die 710 mounted on an IC package 730. IC die 710 includes two transistor manifolds 720a and 720b on which two power amplifiers are fabricated, one transistor manifold for each power amplifier. The two power amplifiers may be implemented with the exemplary design shown in FIG. 4A or 4B or some other design or configuration. IC package 730 includes two load inductors 740a and 740b fabricated on a metal layer in the IC package. IC die 710 is flipped upside down and mounted on IC package 730 such that transistor manifolds 720a and 720b are placed over load inductors 740a and 740b, respectively, on IC package 730. Transistor manifold 720a is electrically connected to load inductor 740a via solder balls 760a and to circuit ground on IC package 730 via solder balls 762a and 764a. Similarly, transistor manifold 720b is electrically connected to load inductor 740b via solder balls 760b and to circuit ground on IC package 730 via solder balls 762b and 764b.

Figure 7B:
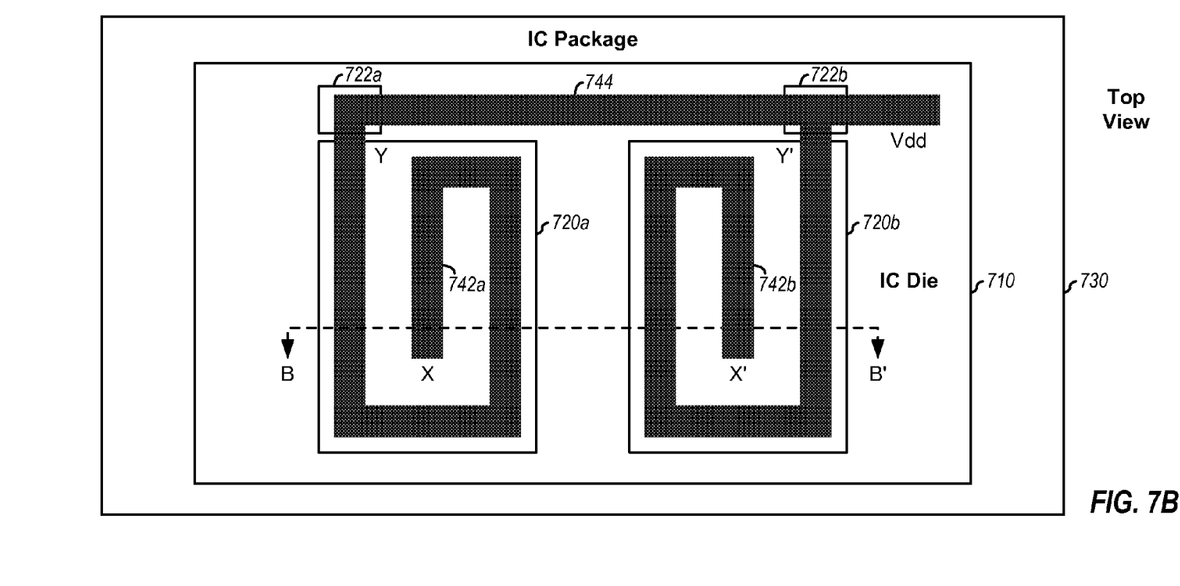

FIG. 7B shows a top view of PA module 700 in FIG. 7A. FIG. 7B shows the outline of transistor manifolds 720a and 720b, the outline of IC die 710, and the outline of IC package 730, which are not shown to scale in FIG. 7B. The side view in FIG. 7A is taken along line B-B' in FIG. 7B (which is a different orientation than the one shown in FIG. 6B).

In the exemplary design shown in FIG. 7B, load inductors 740a and 740b are implemented with metal trace 742a and 742b, respectively, formed on a metal layer in IC package 730. Metal trace 742a is arranged in a counter clockwise spiral pattern, and metal trace 742b is arranged in a clockwise spiral pattern. This arrangement may reduce coupling between load inductors 740a and 740b. This arrangement may also maintain mirror symmetry between the two load inductors 740a and 740b, which would observe asymmetric coupling if they were both wound in the same direction. A first end of metal trace 742a (denoted as X in FIG. 7B) is electrically connected to transistor manifold 720a via solder balls 760a (shown in FIG. 7A). A second end of metal trace 742a (denoted as Y) is electrically connected to a bypass capacitor 722a, which may be fabricated on IC die 710. Similarly, a first end of metal trace 742b (denoted as X') is electrically connected to transistor manifold 720b via solder balls 760b (shown in FIG. 7A). A second end of metal trace 742b (denoted as Y') is electrically connected to a bypass capacitor 722b, which may be fabricated on IC die 710. The length and width of metal traces 742a and 742b for load inductors 740a and 740b may be selected to obtain the desired inductance and low loss for the load inductors. A connection 744 interconnects the second ends of metal traces 742a and 742b and further connects to the Vdd supply.

Referring back to FIG. 7A, a ground section 746a is formed on IC package 730 to the left of load inductor 740a and provides contact for solder balls 762a. A ground section 746b is formed on IC package 730 to the right of load inductor 740b and provides contact for solder balls 764b. A ground section 748 is formed on IC package 730 between load inductors 740a and 740b and provides contact for solder balls 764a and 762b. The ground sections are not shown in FIG. 7B for simplicity.

A single input RF signal may be provided to the two power amplifiers in transistor manifolds 720a and 720b, e.g., for the exemplary design shown in FIG. 4A. Alternatively, two input RF signals may be provided to the two power amplifiers in transistor manifolds 720a and 720b, e.g., for the exemplary design shown in FIG. 4B. The output RF signals from the two power amplifiers in transistor manifolds 720a and 720b may be provided as output signals and/or may be provided to a combiner or a transformer (not shown in FIGS. 7A and 7B).

FIGS. 7A and 7B show an exemplary PA module comprising two power amplifiers and two load inductors. In general, a PA module may include any number of power amplifiers and any number of load inductors. Each power amplifier may be fabricated on a separate transistor manifold, which may compactly implement one or more transistors for the power amplifier. The load inductor for each power amplifier may be efficiently placed under the transistor manifold for that power amplifier. A bypass capacitor may be used for each power amplifier and may cut out a ground loop. In particular, the bypass capacitor may act as a local short in-band, thereby cutting out a lengthy and possibly indeterminate trace to the DC power supply, which would otherwise be the RF ground. A single bypass capacitor may also be used for multiple power amplifiers. The Vdd connection for all power amplifiers may be coupled together and to a common supply pin, e.g., as shown in FIG. 7B. Each load inductor may also be coupled to a separate Vdd connection and/or a separate supply pin. Multiple load inductors may also share a common Vdd connection and/or a common supply pin.

In an exemplary design, an apparatus (e.g., an integrated circuit, a module, a wireless device, etc.) may comprise an IC die and an IC package. The IC die may comprise at least one transistor for a power amplifier and may further comprise a bypass capacitor for the power amplifier. The IC package may comprise a load inductor for the power amplifier. The IC die may be mounted on the IC package with the at least one transistor located over the load inductor, e.g., as shown in FIGS. 6A and 6B.

In an exemplary design, the IC die may include a transistor manifold comprising the at least one transistor. The transistor manifold may be placed over the load inductor on the IC package. The at least one transistor may be fabricated in a first half and a second half of the transistor manifold and may have a drain connection in the center of the transistor manifold, e.g., as shown in FIG. 6C. The at least one transistor may further have (i) a first source connection on a first side of the transistor manifold and (ii) a second source connection on a second side of the transistor manifold opposite of the first side, e.g., as shown in FIG. 6C. In an exemplary design, the transistor manifold may comprise a plurality of conductive lines running across the transistor manifold for the source, gate, and drain of the at least one transistor for the power amplifier, e.g., as shown in FIG. 6D.

In an exemplary design, the at least one transistor for the power amplifier may comprise a single NMOS transistor, e.g., as shown in FIG. 3A. In another exemplary design, the at least one transistor for the power amplifier may comprise a plurality of NMOS transistors coupled in a stack, e.g., as shown in FIG. 3B or 3C. In other exemplary designs, the at least one transistor may comprise one or more transistors of other types.

In an exemplary design, the load inductor for the power amplifier may be implemented with a metal trace formed on a metal layer of the IC package and may be arranged in a spiral pattern, e.g., as shown in FIG. 6B. The at least one transistor on the IC die may be electrically connected to the load inductor on the IC package via at least one solder ball.

In an exemplary design, only the at least one transistor for the power amplifier and no other active circuits on the IC die may be located over the load inductor on the IC package. In another exemplary design, only the load inductor and no other circuit component on the IC package may be located under the IC die. Ground sections and/or power supply sections on the IC package may also be located under the IC die. The IC die may also be mounted on the IC package in other manners.

In an exemplary design, the IC die may further comprise at least one additional transistor for a second power amplifier, and the IC package may further comprise a second load inductor for the second power amplifier. The IC die may be mounted on the IC package with (i) the at least one transistor located over the load inductor for the power amplifier and (ii) the at least one additional transistor located over the second load inductor for the second power amplifier, e.g., as shown in FIGS. 7A and 7B.

In an exemplary design, the power amplifier may receive an input RF signal and provide a first output RF signal. The second power amplifier may also receive the input RF signal and provide a second output RF signal, e.g., as shown in FIG. 4A. In another exemplary design, the power amplifier and the second power amplifier may receive a differential input RF signal and provide a differential output RF signal, e.g., as shown in FIG. 4B.

In an exemplary design, the load inductor may be implemented with a first metal trace arranged in a counter clockwise spiral pattern. The second load inductor may be implemented with a second metal trace arranged in a clockwise spiral pattern, e.g., as shown in FIG. 7B. The load inductor and the second load inductor may be formed side by side on the IC package. The IC package may comprise a ground section between the two load inductors. The IC package may also comprise ground sections on the outside of the two load inductors, e.g., as shown in FIG. 7A.

In another exemplary design, an integrated circuit may comprise an IC die and an IC package. The IC die may comprise at least one transistor for a power amplifier. The IC package may comprise a load inductor for the power amplifier. The IC die may be mounted on the IC package with the at least one transistor located over the load inductor. The IC die may further comprise at least one additional transistor for a second power amplifier, and the IC package may further comprise a second load inductor for the second power amplifier. The IC die may be mounted on the IC package with the at least one additional transistor located over the second load inductor.

Figure 8:
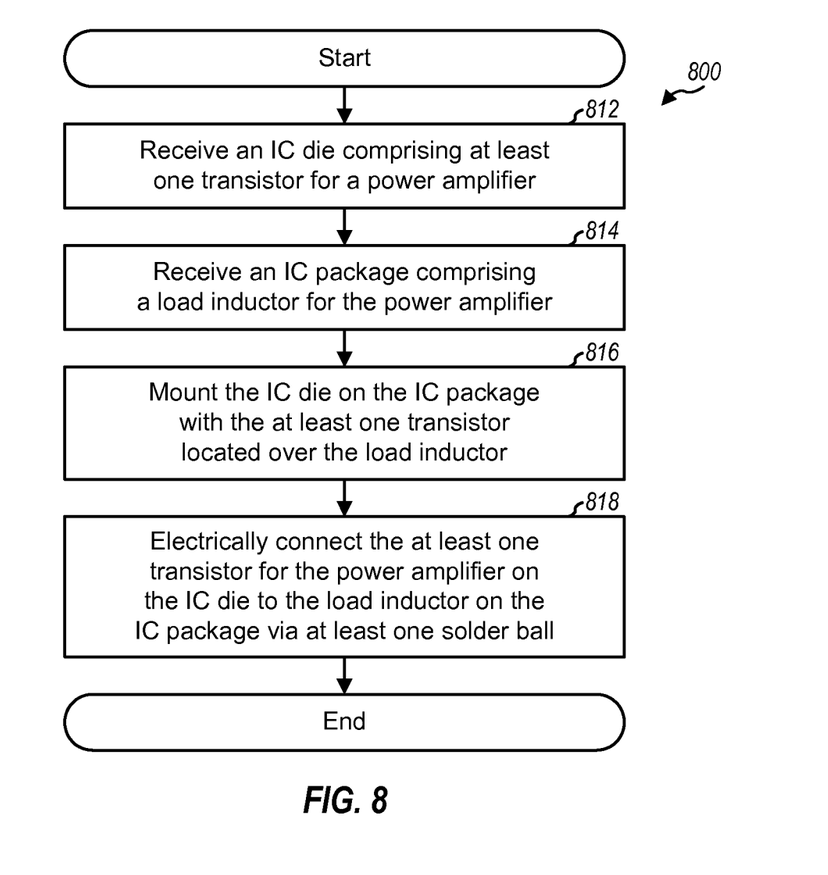
FIG. 8 shows a process for forming an integrated power amplifier.

FIG. 8 shows an exemplary design of a process 800 for forming an apparatus, e.g., an integrated circuit, a module, a wireless device, etc. An IC die comprising at least one transistor for a power amplifier may be received (block 812). An IC package comprising a load inductor for the power amplifier may also be received (block 814). The IC die may be mounted on the IC package with the at least one transistor located over the load inductor (block 816). The at least one transistor on the IC die may be electrically connected to the load inductor on the IC package via at least one solder ball (block 818).

The IC die may include a transistor manifold comprising the at least one transistor. The IC die may be mounted on the IC package with the transistor manifold placed over the load inductor on the IC package. A drain connection for the at least one transistor in the center of the transistor manifold may be electrically connected to the load inductor on the IC package. A first source connection for the at least one transistor on a first side of the transistor manifold and a second source connection for the at least one transistor on a second side of the transistor manifold may be electrically connected to circuit ground on the IC package.

The IC die may further comprise at least one additional transistor for a second power amplifier. The IC package may further comprise a second load inductor for the second power amplifier. The IC die may be mounted on the IC package with the at least one additional transistor located over the second load inductor.

The integrated power amplifier described herein may be implemented on an IC, an analog IC, an RFIC, a mixed-signal IC, an ASIC, a printed circuit board (PCB), an electronic device, etc. The integrated power amplifier may also be fabricated with various IC process technologies such as complementary metal oxide semiconductor (CMOS), NMOS, PMOS, silicon-on-insulator (SOI), BJT, bipolar-CMOS (BiCMOS), SiGe, GaAs, heterojunction bipolar transistors (HBTs), high electron mobility transistors (HEMTs), etc.

An apparatus implementing the integrated power amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as an MSM, (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    an integrated circuit (IC) die comprising a transistor manifold having at least one transistor for a power amplifier and including a first source connection on a first side of the transistor manifold and a second source connection on a second, opposite side of the transistor manifold; and
    an IC package comprising a load inductor for the power amplifier coupled between the power amplifier and a supply voltage, the IC die is mounted on the IC package with the at least one transistor located over and electrically coupled to the load inductor.

2. The apparatus of claim 1, the IC die includes a transistor manifold comprising the at least one transistor, the transistor manifold is placed over the load inductor on the IC package.

3. The apparatus of claim 2, the at least one transistor is fabricated in a first half and a second half of the transistor manifold and has a drain connection in a center of the transistor manifold.

4. The apparatus of claim 2, the at least one transistor has a first source connection on a first side of the transistor manifold and a second source connection on a second side of the transistor manifold.

5. The apparatus of claim 2, the transistor manifold comprises a plurality of conductive lines for source, gate, and drain of the at least one transistor for the power amplifier.

6. The apparatus of claim 2, the at least one transistor for the power amplifier comprises a plurality of N-channel metal oxide semiconductor (NMOS) transistors coupled in a stack.

7. The apparatus of claim 1, the load inductor for the power amplifier is implemented with a metal trace formed on a metal layer of the IC package and arranged in a spiral pattern.

8. The apparatus of claim 1, the IC die further comprises a bypass capacitor for the power amplifier.

9. The apparatus of claim 1, the at least one transistor for the power amplifier on the IC die is electrically connected to the load inductor on the IC package via at least one solder ball.

10. The apparatus of claim 1, only the at least one transistor for the power amplifier and no other active circuits on the IC die are located over the load inductor on the IC package.

11. The apparatus of claim 1, only the load inductor and no other circuit component on the IC package is located under the IC die.

12. The apparatus of claim 1, the IC die further comprises at least one additional transistor for a second power amplifier, the IC package further comprises a second load inductor for the second power amplifier, and the IC die is mounted on the IC package with the at least one additional transistor located over the second load inductor.

13. The apparatus of claim 12, the power amplifier receives an input radio frequency (RF) signal and provides a first output RF signal, and the second power amplifier also receives the input RF signal and provides a second output RF signal.

14. The apparatus of claim 12, the power amplifier and the second power amplifier receive a differential input radio frequency (RF) signal and provide a differential output RF signal.

15. The apparatus of claim 12, the load inductor is implemented with a first metal trace arranged in a counter clockwise spiral pattern, and the second load inductor is implemented with a second metal trace arranged in a clockwise spiral pattern.

16. The apparatus of claim 12, the load inductor and the second load inductor are formed side by side on the IC package.

17. The apparatus of claim 12, the IC package comprises a ground section between the load inductor and the second load inductor.

18. An integrated circuit (IC) comprising:
    an IC die comprising a transistor manifold having at least one transistor for a power amplifier and including a first source connection on a first side of the transistor manifold and a second source connection on a second, opposite side of the transistor manifold; and an IC package comprising a load inductor for the power amplifier coupled between the power amplifier and a supply voltage, the IC die is mounted on the IC package with the at least one transistor located over and electrically coupled to the load inductor.

19. The integrated circuit of claim 18, the IC die further comprises at least one additional transistor for a second power amplifier, the IC package further comprises a second load inductor for the second power amplifier, and the IC die is mounted on the IC package with the at least one additional transistor located over the second load inductor.

20. A method comprising:
receiving an integrated circuit (IC) die comprising a transistor manifold having at least one transistor for a power amplifier and including a first source connection on a first side of the transistor manifold and a second source connection on a second, opposite side of the transistor manifold;
receiving an IC package comprising a load inductor for the power amplifier coupled between the power amplifier and a supply voltage; and
mounting the IC die on the IC package with the at least one transistor located over and electrically coupled to the load inductor.

21. The method of claim 20, the IC die includes a transistor manifold comprising the at least one transistor, and the mounting the IC die on the IC package comprises placing the transistor manifold over the load inductor on the IC package.

22. The method of claim 21, further comprising:
electrically connecting a drain connection for the at least one transistor in a center of the transistor manifold to the load inductor on the IC package;
electrically connecting a first source connection for the at least one transistor on a first side of the transistor manifold to circuit ground on the IC package; and
electrically connecting a second source connection for the at least one transistor on a second side of the transistor manifold to circuit ground on the IC package.

23. The method of claim 20, further comprising:
electrically connecting the at least one transistor for the power amplifier on the IC die to the load inductor on the IC package via at least one solder ball.

24. The method of claim 20, the IC die further comprises at least one additional transistor for a second power amplifier, the IC package further comprises a second load inductor for the second power amplifier, and the mounting the IC die on the IC package further comprises mounting the IC die on the IC package with the at least one additional transistor located over the second load inductor.

25. An apparatus comprising:
means for receiving an integrated circuit (IC) die comprising a transistor manifold having at least one transistor for a power amplifier and including a first source connection on a first side of the transistor manifold and a second source connection on a second, opposite side of the transistor manifold;
means for receiving an IC package comprising a load inductor for the power amplifier coupled between the power amplifier and a supply voltage; and
means for mounting the IC die on the IC package with the at least one transistor located over and electrically coupled to the load inductor.

* * * * *